(12) United States Patent
Tang et al.

(10) Patent No.: US 11,398,287 B2
(45) Date of Patent: Jul. 26, 2022

(54) INPUT/OUTPUT CIRCUIT INTERNAL LOOPBACK

(71) Applicant: SanDisk Technologies LLC, Addison, TX (US)

(72) Inventors: Tianyu Tang, Milpitas, CA (US); Venkatesh Ramachandra, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 220 days.

(21) Appl. No.: 16/828,547

(22) Filed: Mar. 24, 2020

(65) Prior Publication Data

US 2021/0304834 A1 Sep. 30, 2021

(51) Int. Cl.
*G11C 29/02* (2006.01)
*G11C 16/10* (2006.01)
*G11C 29/12* (2006.01)
*G11C 16/30* (2006.01)
*G11C 16/26* (2006.01)

(52) U.S. Cl.
CPC ............ *G11C 29/022* (2013.01); *G11C 16/10* (2013.01); *G11C 16/26* (2013.01); *G11C 16/30* (2013.01); *G11C 29/1201* (2013.01); *G11C 29/12005* (2013.01)

(58) Field of Classification Search
None
See application file for complete search history.

(56) References Cited

U.S. PATENT DOCUMENTS

| 9,063,561 | B2 | 6/2015 | Noeldner et al. |
| 9,411,722 | B2 | 8/2016 | Yap |
| 9,646,708 | B2 | 5/2017 | Miwa |
| 10,530,347 | B2 | 1/2020 | Tang et al. |
| 2015/0185285 | A1 | 7/2015 | Kovalev et al. |
| 2018/0350445 | A1 | 12/2018 | Linnen et al. |
| 2019/0195948 | A1 | 6/2019 | Kaur et al. |
| 2019/0296723 | A1 | 9/2019 | Tang et al. |

OTHER PUBLICATIONS

ONFI, "Open NAND Flash Interface Specification," Specification, Rev. 4.2, Feb. 12, 2020, 340 pages.

*Primary Examiner* — Guerrier Merant
(74) *Attorney, Agent, or Firm* — Vierra Magen Marcus LLP

(57) ABSTRACT

Technology is disclosed herein for a semiconductor die, and controlling operation of the semiconductor die. In some aspects, a semiconductor die is configured to test an I/O circuit on the semiconductor die. The semiconductor die has an input circuit that compares a voltage signal at one of a first input or a second input with a reference voltage at the other of the first input or the second input to generate an input voltage signal. The first input may be connected to an I/O contact. During a normal mode a control circuit on the die provides a reference voltage to second input. During a test mode, the control circuit internally loops back a test signal from an output circuit to the second input of the input circuit. Thus, the test signal avoids the I/O contact.

20 Claims, 11 Drawing Sheets

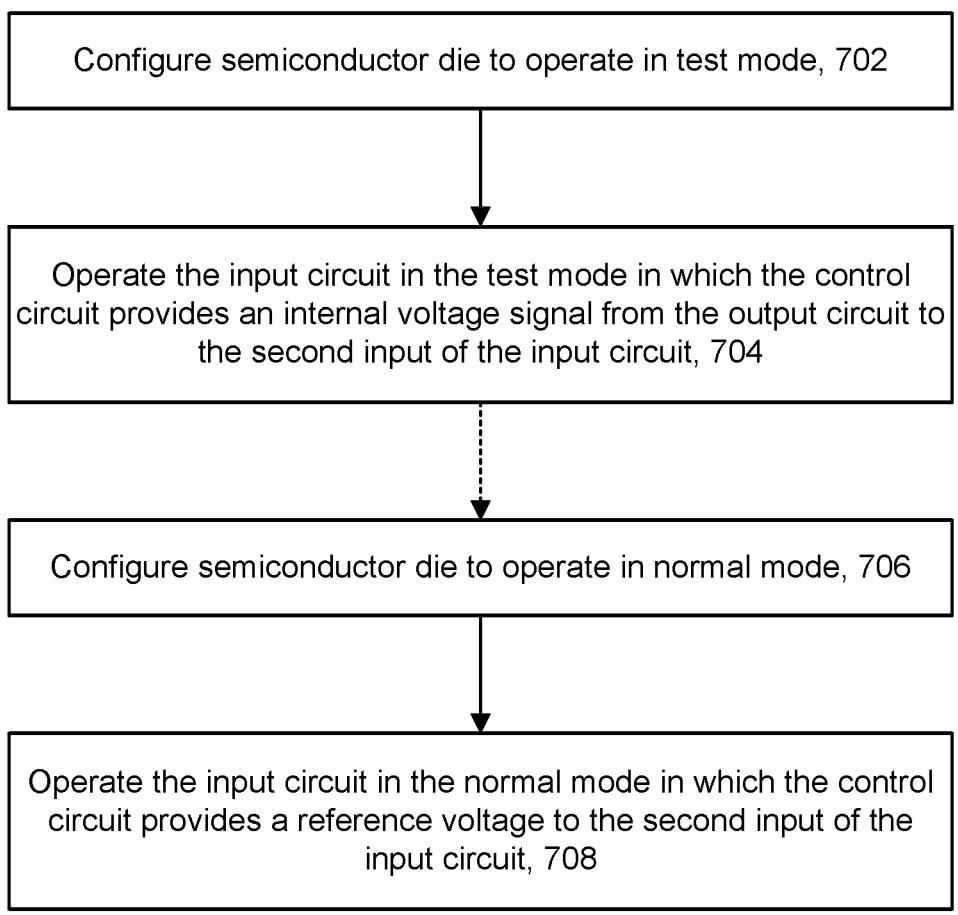

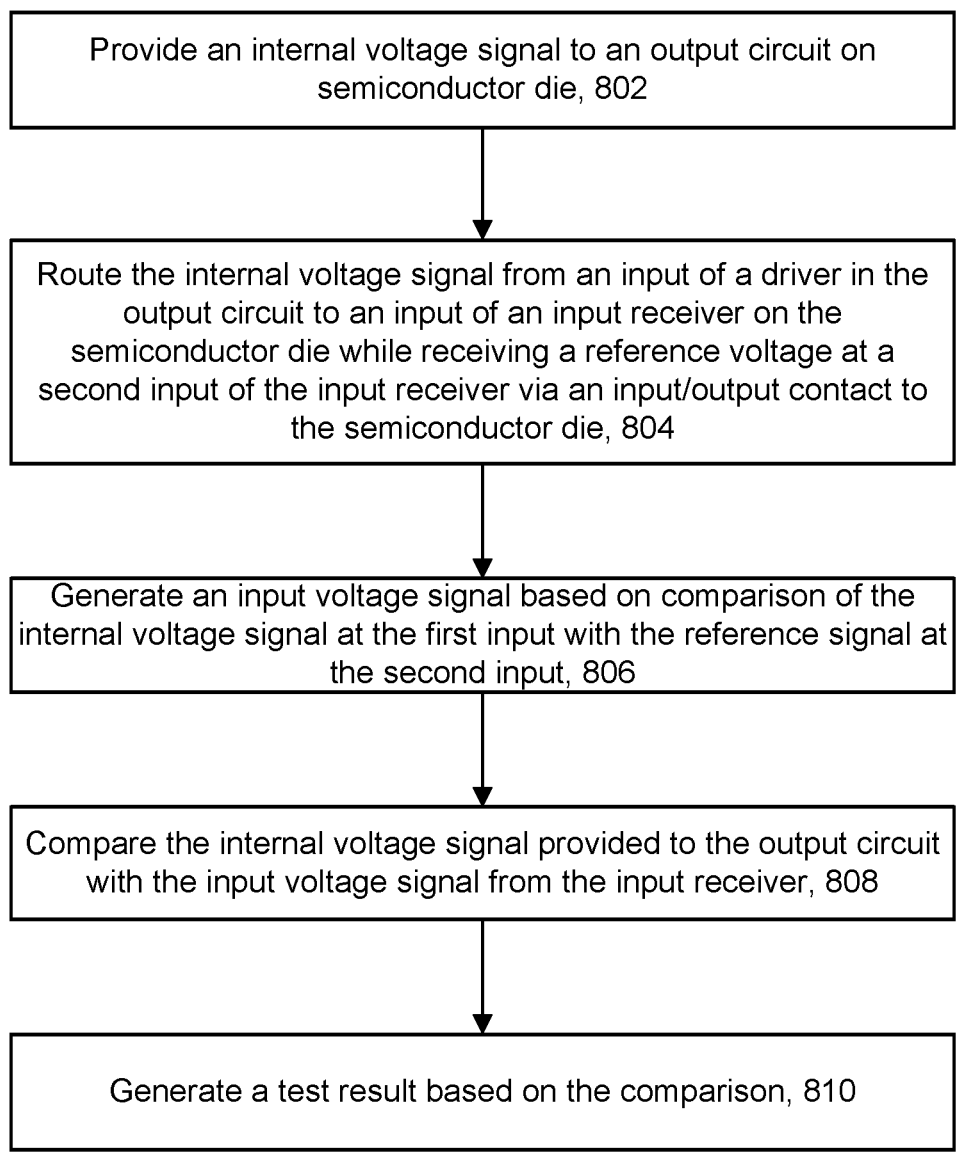

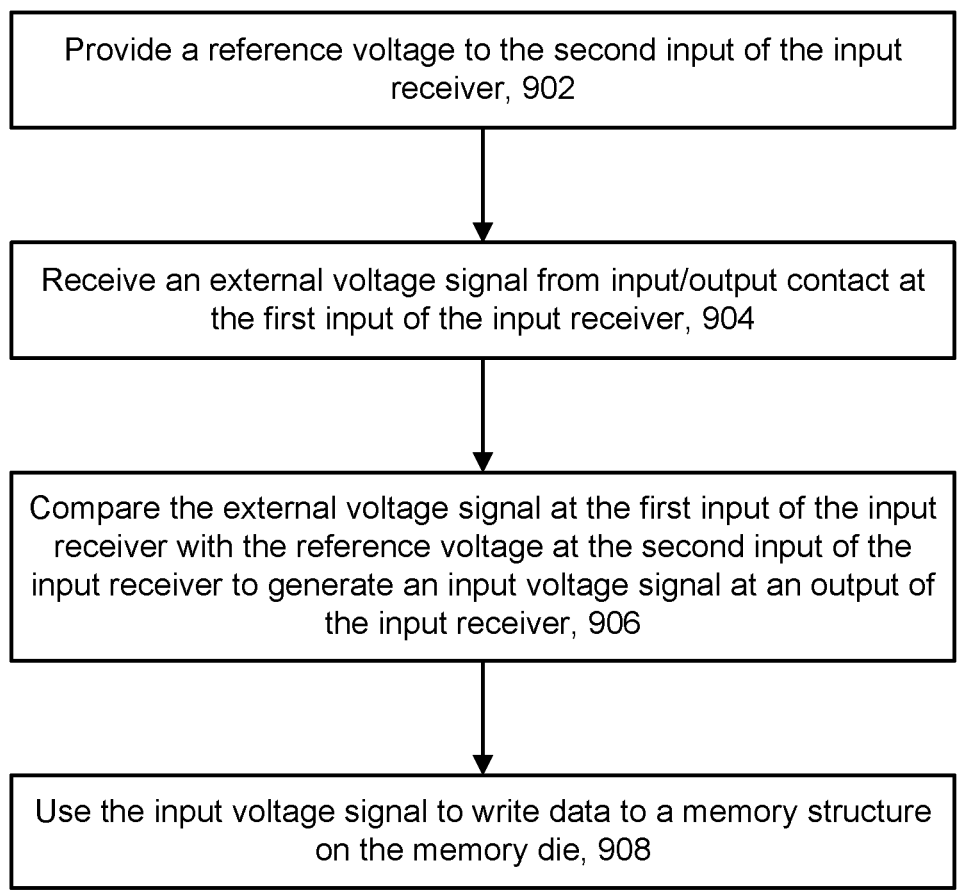

INPUT/OUTPUT CIRCUIT INTERNAL LOOPBACK

BACKGROUND

Semiconductor dies typically have input/output (I/O) circuitry to allow for data input and data output. Input/output circuitry may provide other functionality, such as to allow control signals to be provided to the semiconductor die. Typically, the semiconductor die has some type of I/O contacts that provide an electrical interface to the semiconductor die to allow for input/output of data, control signals, etc. The I/O contacts may include, for example, contact pads on a surface of the semiconductor die. Depending on the context, the I/O contacts could include other conductive elements. For example, the semiconductor die may be placed into a package that has contact pins that are electrically connected to the contact pads.

As one example, a semiconductor die may contain memory and I/O circuitry that is accessible via the I/O contacts to allow data to be stored into and retrieved from the memory. Semiconductor memory may comprise non-volatile memory or volatile memory. A non-volatile memory allows information to be stored and retained even when the non-volatile memory is not connected to a source of power (e.g., a battery). Such semiconductor die are widely used in various electronic devices such as cellular telephones, digital cameras, personal digital assistants, medical electronics, mobile computing devices, servers, solid state drives, non-mobile computing devices and other devices.

BRIEF DESCRIPTION OF THE DRAWINGS

Like-numbered elements refer to common components in the different figures.

FIG. 7 depicts a flowchart of one embodiment of a process of operating a data input circuit in two modes.

FIG. 8 depicts a flowchart of one embodiment of a process of controlling a semiconductor die during a test mode.

FIG. 9 depicts a flowchart of one embodiment of a process of controlling a memory die in the normal mode.

DETAILED DESCRIPTION

Figure 1:
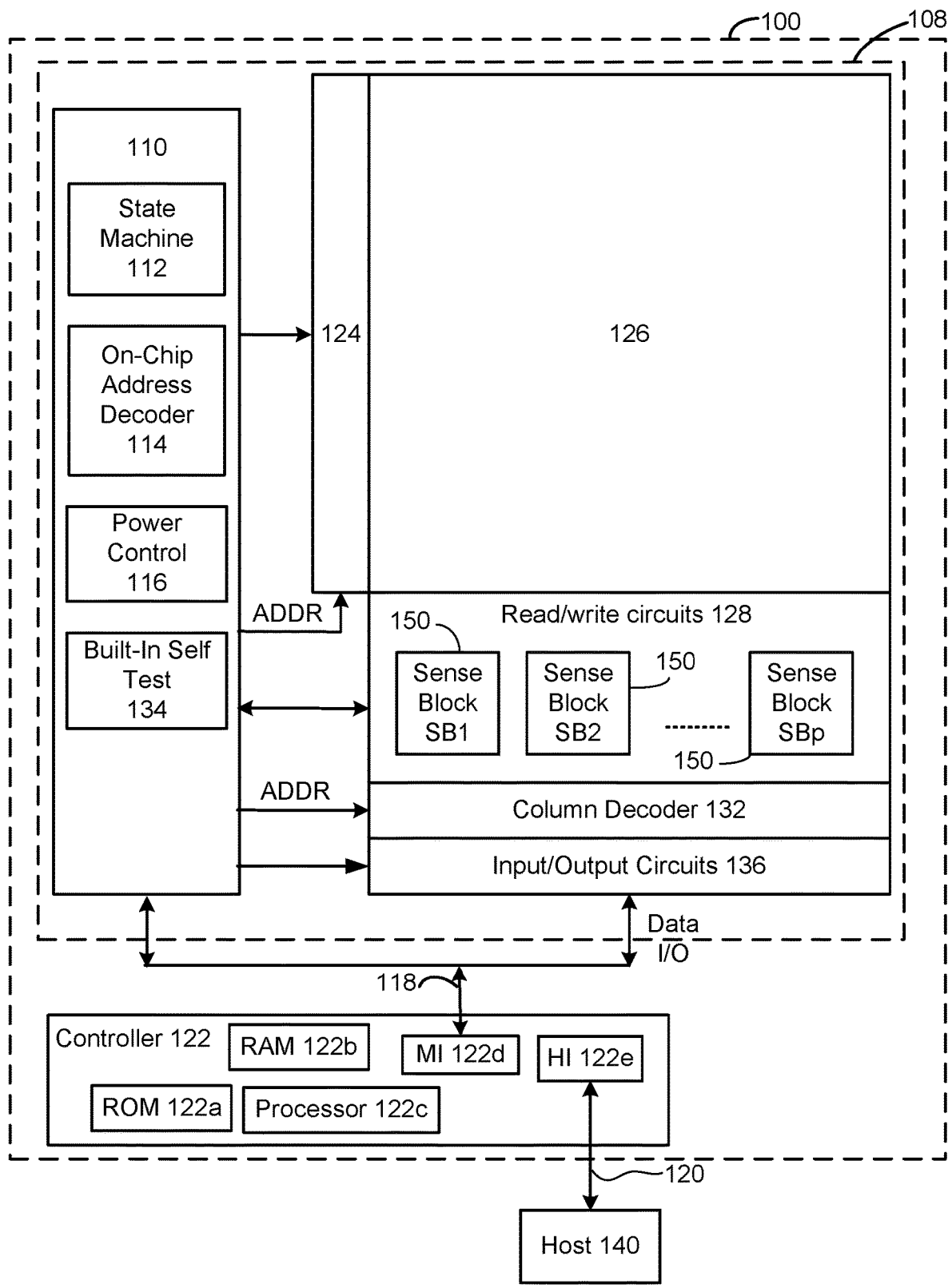
FIG. 1 is a functional block diagram of one embodiment of a memory device.

Technology is disclosed herein for a semiconductor die, and controlling operation of the semiconductor die. Some embodiments include a semiconductor die that is configured to test an I/O circuit on the semiconductor die. In one embodiment, the semiconductor die has an input circuit associated with a first I/O contact and an output circuit associated with a second I/O contact. The input circuit may have a first input and a second input. The input circuit may be configured to compare a voltage signal at one of the first input or the second input with a reference voltage at the other of the first input or the second input to generate an input voltage signal. Herein, a "voltage signal" refers to a voltage that toggles between two states (e.g., between two voltages). In contrast, the reference voltage does not toggle between two states. The result of the comparison is referred to herein as an input voltage signal.

The first input of the input circuit may be connected to first I/O contact. In one embodiment, the semiconductor die has a control circuit configured to operate in a first mode in which the control circuit provides a reference voltage to the second input of the input circuit. During the first mode, a voltage signal at the first I/O contact may be provided to the first input. In one embodiment, the control circuit is further configured to operate in a second mode in which the control circuit provides a voltage signal from the output circuit to the second input of the input circuit. The second mode may be a test mode in which the control circuit internally loop back a test voltage signal from the output circuit to the input circuit. Thus, the entire input circuit and essentially the entire output circuit may be tested. During the first mode, a reference voltage at the first I/O contact may be provided to the first input. Under some conditions, it may be impractical or expensive to provide a voltage signal to the first input by way of the first I/O contact. For example, in a testing environment, it may be impractical or expensive to provide a high speed voltage signal to the first input by way of the first I/O contact.

Under at least some conditions, the I/O contacts may have a high capacitance. For example, the I/O contacts may have a high capacitance during die sort (also referred to as wafer sort). Die sort refers to testing of the memory die after fabrication. As a result of such tests, the tested semiconductor dies might be classified for different categories of use. For example, the best performing semiconductor dies might be classified for most demanding use, with semiconductor dies that perform less well but still at an acceptable level classified for less demanding use. Some semiconductor dies could be discarded.

It can be challenging to test the semiconductor dies due to factors such as high capacitance at the I/O contacts. For example, it may be difficult to test whether an I/O circuit is capable of high speed signal transfer due to high capacitance at the I/O contacts. For example, were a test voltage signal to be transferred over a node in contact with one of the I/O contacts, the high capacitance at the node could make the test voltage signal itself unreliable, thereby compromising the test.

In one embodiment, an I/O circuit in a semiconductor die is tested by looping back a test voltage signal from an output circuit to an input circuit. By looping back the test voltage signal internally, a high capacitance node (such as an I/O contact) is avoided. If the test voltage signal were to be transferred over a node connected to the I/O contact, then the integrity if the test voltage signal could be comprised. As a result, the test of the I/O circuit may be inaccurate. This may be especially true if the test voltage signal is a high speed voltage signal. For some techniques, testing of the I/O circuit is only practical for lower speed voltage signals. Technology disclosed herein is able to accurately test the I/O pathway for transfer of high speed voltage signals. Also, the test of the I/O circuit does not require expensive or complex circuitry, and hence is economical.

Figure 2:
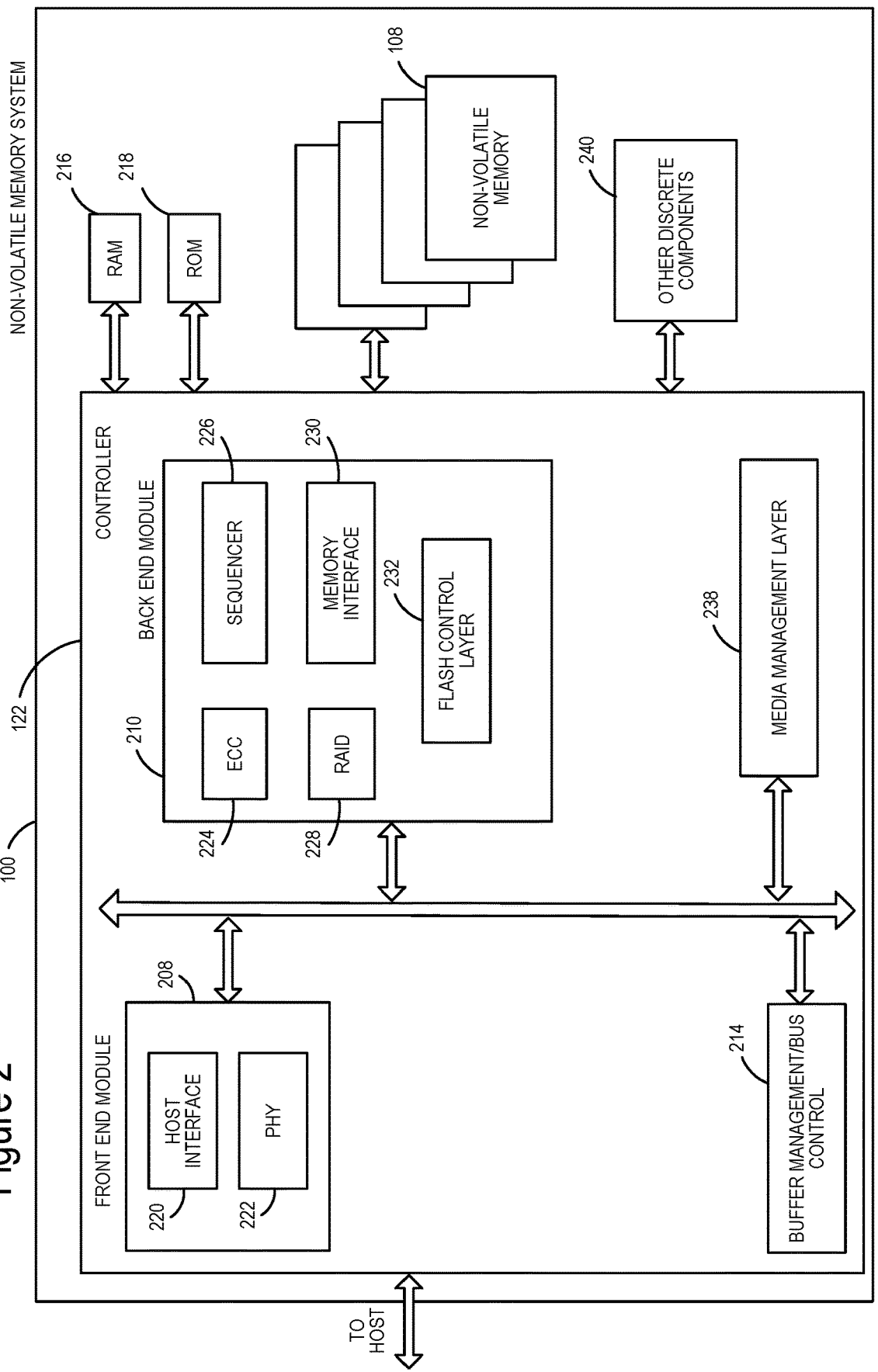
FIG. 2 is a block diagram depicting one embodiment of a memory system.

FIG. 1-FIG. 2 describe one example of a memory system that can be used to implement the technology proposed herein. FIG. 1 is a functional block diagram of an example memory system 100. The components depicted in FIG. 1 are electrical circuits. Memory system 100 includes one or more memory dies 108. In one embodiment, each memory die 108 includes a memory structure 126, control circuitry 110, read/write circuits 128, row decoder 124, column decoder 132, and input/output circuits 136. Memory structure 126 is addressable by word lines via the row decoder 124 and by bit lines via the column decoder 132. The read/write circuits 128 include multiple sense blocks 150 including SB1, SB2, . . . , SBp (sensing circuitry) and allow a page of memory cells to be read or programmed in parallel. Also, many strings of memory cells can be erased in parallel. The input/output (I/O) circuits 136 provide for data I/O with the controller 122. The I/O circuits 136 may contain an input circuit and an output circuit. The I/O circuits 136 provide at least part of an I/O data pathway between read/write circuits 128 and lines 118.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) contacts that connect to lines 118. The I/O contacts may include contact pads that are in electrical contact with the memory die. In one embodiment, the contact pads are bonded to a surface of the memory die 108. The I/O contacts may further include contact pins that make electrical connection to the contact pads, and provide a connection to lines 118. Herein, any of memory die 108, the combination of memory die 108 and controller 122, or the combination of memory die 108, the controller 122, and the host 140 may be referred to as an apparatus.

Control circuitry 110 cooperates with the read/write circuits 128 to perform memory operations (e.g., write, read, erase and others) on memory structure 126, and includes state machine 112, an on-chip address decoder 114, a power control circuit 116, and built-in self-test circuit 134. In one embodiment, control circuitry 110 includes buffers such as registers, ROM fuses and other storage devices for storing default values such as base voltages and other parameters. In one embodiment, the state machine 112 is programmable by software. In other embodiments, the state machine does not use software and is completely implemented in hardware (e.g., electrical circuits).

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The sense blocks may include sense amplifiers. The power control circuit 116 executes under control of the state machine 112, in one embodiment.

In one embodiment, all or a subset of control circuitry 110, in combination with all or a subset of the other circuits depicted on the memory die 108 in FIG. 1, can be considered a control circuit that performs the functions described herein. In one embodiment, built-in self-test circuit 134 and state machine 112 can be considered a control circuit that performs the functions described herein. In one embodiment, control circuitry 110 and/or controller 122 (or equivalently functioned circuits), can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

In one embodiment, the control circuitry 110 operates the input/output circuits 136 in a normal mode in order to transfer data over lines 118, such that the controller 122 may program data into structure 126, as well as read data from structure 126. The built-in self-test circuit 134 is able to test at least some of the circuits on the die 108 for proper operation. In one embodiment, the built-in self-test circuit 134 tests the input/output circuits 136. In one embodiment, the control circuitry 110 operates the input/output circuits 136 in test mode in which, for example, input/output circuits 136 may be tested. During one embodiment of the test mode, a voltage signal (e.g., data) is not transferred over lines 118. Instead, the built-in self-test circuit 134 generates a test voltage signal and provides the test voltage signal to an output circuit in the I/O circuits 136. Rather than transferring the test voltage signal over lines 118, the test voltage signal is internally looped back to an input circuit in the I/O circuits 136. The input circuit provides the test voltage signal back to the built-in self-test circuit 134 which compares this test voltage signal with the version provided to the output circuit. The built-in self-test circuit 134 generates a test result based on the comparison. The test result may be provided over lines 118 in order to report whether the I/O circuits 136 are operating properly.

Under at least some conditions, the I/O contacts may have a very high capacitance. For example, the I/O contacts may have a very high capacitance during die sort (also referred to as wafer sort). Die sort refers to testing of the memory die 108 after fabrication. As a result of such tests, the tested memory dies might be classified for different categories of use. For example, the best performing memory die might be classified for most demanding use, with memory die that perform less well but still at an acceptable level classified for less demanding use. Some memory die could be discarded.

It can be challenging to test the memory die 108 due to factors such as high capacitance at the I/O contacts. For example, it may be difficult to test whether the I/O circuits 136 are capable of high speed data transfer due to high capacitance at the I/O contacts. For example, were the test voltage signal to be transferred over a node in contact with one of the I/O contacts, the high capacitance at the node could make the test voltage signal itself unreliable, thereby compromising the test.

In one embodiment, by looping back the test voltage signal internally, a high capacitance node (such as an I/O contact) is avoided. In one embodiment, an input circuit operates by comparing a voltage signal with a reference voltage. The voltage signal refers to a voltage signal that toggles between two states (e.g., two voltages). The input circuit generates an input voltage signal based on the comparison of the voltage signal with the reference voltage. Hence, the integrity of the voltage signal may be compromised if the voltage signal is transferred over a high capacitance node. If the voltage signal is not able to rise above the reference voltage (or fall below the reference voltage), then the output of the input circuit will be incorrect.

In one embodiment, the input circuit has two input nodes in order to compare the voltage signal with the reference voltage. In one embodiment, during a normal mode the voltage signal is provided to a first input node of the input circuit via an I/O contact, and the control circuitry 110 provides a reference voltage to a second input node of the input circuit. In one embodiment, during a test mode the roles of the two input nodes are reversed relative to the operation during normal mode. In one embodiment, during the test mode the control circuitry 110 routs a test voltage signal from an output circuit to the first input node of the input circuit, and the reference voltage is provided to the second input node of the input circuit. In one embodiment, the reference voltage is provided to the second input node of the input circuit via an I/O contact. Since the reference voltage does not toggle, the high capacitance at the I/O contact is not a problem. The high capacitance can actually help to stabilize the reference voltage. Therefore, high speed operation of the I/O circuits 136 may be efficiently and accurately tested.

The (on-chip or off-chip) controller 122 (which in one embodiment is an electrical circuit) may comprise one or more processors 122*c*, ROM 122*a*, RAM 122*b*, a memory interface (MI) 122*d* and a host interface (HI) 122*e*, all of which are interconnected. The storage devices (ROM 122*a*, RAM 122*b*) store code (software) such as a set of instructions (including firmware), and one or more processors 122*c* is/are operable to execute the set of instructions to provide the functionality described herein. Alternatively or additionally, one or more processors 122*c* can access code from a storage device in the memory structure, such as a reserved area of memory cells connected to one or more word lines. RAM 122*b* can be to store data for controller 122, including caching program data (discussed below). Memory interface 122*d*, in communication with ROM 122*a*, RAM 122*b* and processor 122*c*, is an electrical circuit that provides an electrical interface between controller 122 and one or more memory die 108. For example, memory interface 122*d* can change the format or timing of signals, provide a buffer, isolate from surges, latch I/O, etc. One or more processors 122*c* can issue commands to control circuitry 110 (or another component of memory die 108) via Memory Interface 122*d*. Host interface 122*e* provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block. The MML 238 understands these potential limitations of the memory 126 which may not be visible to the host. Accordingly, the MML 238 attempts to translate the writes from host into writes into the memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
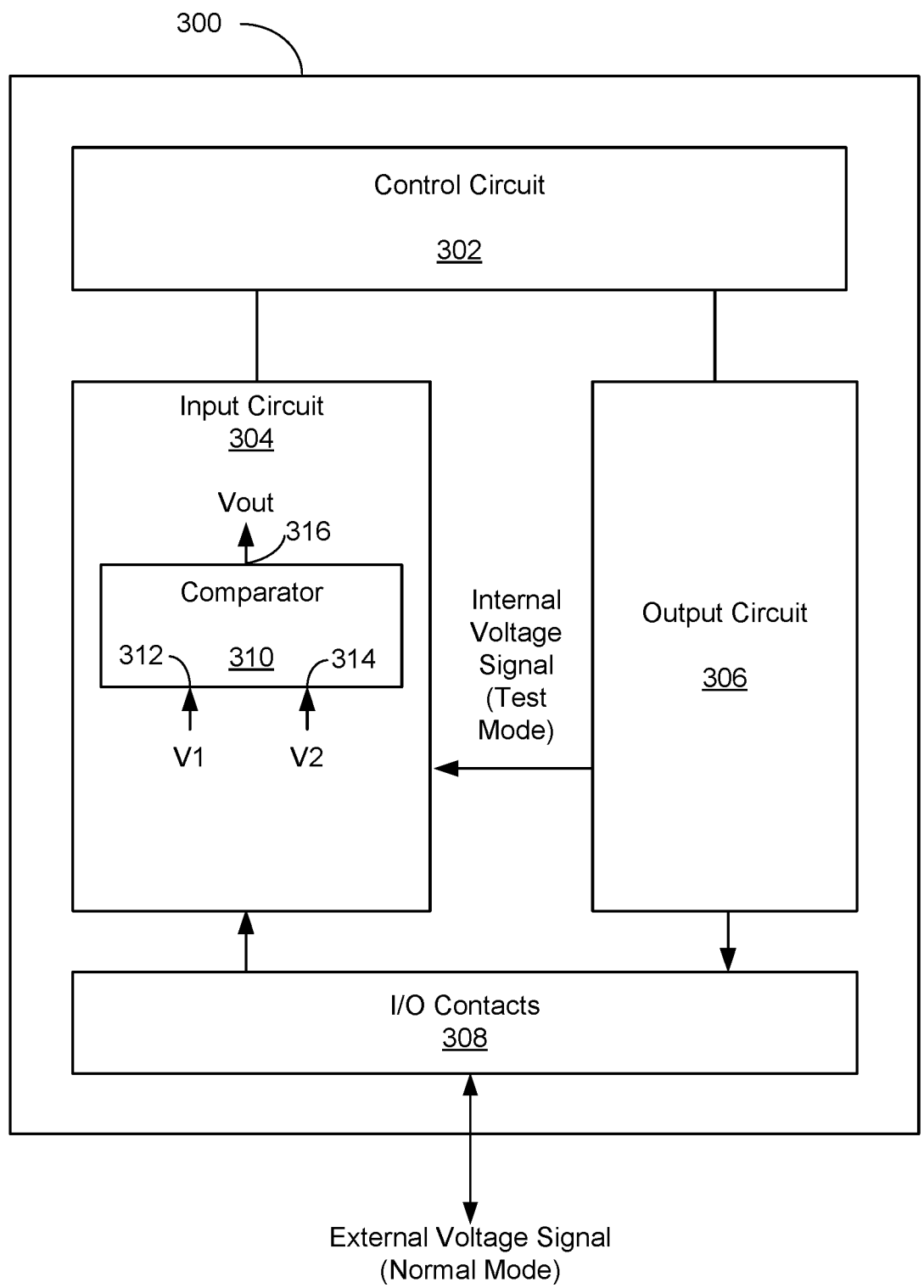
FIG. 3 depicts one embodiment of a semiconductor die.

FIG. 3 depicts one embodiment of a semiconductor die 300. In one embodiment, the semiconductor die 300 is a memory die 108 having a memory structure 126. However, semiconductor die 300 is not required to be a memory die. The semiconductor die 300 has a control circuit 302, input circuit 304, output circuit 306, and input/output (I/O) contacts 308. In one embodiment, the I/O contacts 308 include contact pads that reside on the surface of the semiconductor die 300. The contact pads may be bonded to the surface of the semiconductor die 300. The I/O contacts 308 could include other conductive elements in addition to the contact pads. In some embodiments, the semiconductor die 300 is placed within a package. In some embodiments, there are contact pins that provide an electrical connection from the contact pads to outside the package. If the semiconductor die 300 is within a package, contact pins (or the like) may be considered to be a part of the I/O contacts 308.

The control circuit 302 is configured to control operation of the input circuit 304 and the output circuit 306. In an embodiment, the control circuit 302 operates the semiconductor die 300 in a normal mode and a test mode. During the normal mode, the output circuit 306 is used to send out data through the I/O contacts 308 and the input circuit 304 is used to receive data from the I/O contacts 308. During the test mode, data is routed from the output circuit 306 to the input circuit 304. Thus, the I/O contacts 308 may be avoided during the test mode. There may be a very high capacitance at the I/O contacts 308, under at least some conditions. For example, during die sort the capacitance at the I/O contacts 308 can be very high. However, the capacitance at the I/O contacts 308 could be high at other times. Such high capacitance can make it difficult to test operation of the input circuit 304 and/or the output circuit 306. Technology is described herein for efficiently and accurately testing the input circuit 304 and/or the output circuit 306. In some embodiments, high speed operation of the input circuit 304 and/or the output circuit 306 is tested. High speed operation may be, for example, a rate of greater than 400 Mbs.

The control circuit 302 can include hardware only or a combination of hardware and software (including firmware). The control circuit 302 can include a processor, PGA (Programmable Gate Array, FPGA (Field Programmable Gate Array), ASIC (Application Specific Integrated Circuit), integrated circuit or other type of circuit. Herein, the semiconductor die 300 may be referred to as an apparatus.

In one embodiment, the input circuit 304 has a comparator 310 with two inputs 312, 314. The comparator 310 compares the magnitude of a voltage (e.g., V1) at a first input 312 with the magnitude of a voltage (e.g., V2) at a second input 314 and outputs a voltage (Vout) at the output 316 based on the comparison. For example, if V1 is greater than V2, then Vout may have a first magnitude (e.g., a high voltage), but if V1 is not greater than V2, then Vout may have a second magnitude (e.g., a low voltage). In one embodiment, the comparator 310 may comprise an input receiver.

In one embodiment, one input voltage is a voltage signal, whereas the other input voltage is a reference voltage. The voltage signal is a signal that toggles between two states. The reference voltage does not toggle and has a magnitude that is somewhere between the two states of the voltage signal. The reference voltage may have a substantially constant magnitude. The magnitude of the reference voltage could vary somewhat due to, for example, noise or other non-ideal factors. Thus, the reference voltage may be used to determine which of the two states that voltage signal is presently in. The output 316 of the comparator 310 may thus be an input voltage signal, which toggles between two states.

The comparator 310 is able to operate with the reference voltage at either the first input 312 or the second input 314. Likewise, the comparator 310 is able to operate with the voltage signal at either the first input 312 or the second input 314. In one embodiment, during a normal mode, the voltage signal is received at the first input 312, whereas the reference voltage is provided by the control circuit 302 to the second input 314. The voltage signal may be received at an I/O contact 308 during the normal mode. Herein, a voltage signal that is received on an I/O contact 308 may be referred to as an "external voltage signal." The external voltage signal may be provided by the controller 122.

In one embodiment, during a test mode, the control circuit 302 provides the voltage signal to the second input 314, whereas the reference voltage is received at the first input 312. During the test mode, the control circuit 302 may route the voltage signal from the output circuit 306 to the second input 314. Herein, a voltage signal that is routed from the output circuit 306 to the input circuit 304 may be referred to as an "internal voltage signal." In one embodiment of the test mode, the reference voltage is provided to the first input 312 via an I/O contact 308.

During the normal mode, the input circuit 304 inputs a voltage signal from the I/O contacts 308, under control of the control circuit 302. Thus, during the normal mode, the voltage signal is not routed from the output circuit 306 to the input circuit 304. In one embodiment, the input circuit 304 inputs a data signal, which refers to a voltage signal that contains data. For example, the data signal may contain data to be stored in a memory structure. However, the input circuit 304 may input a voltage signal that is not a data signal. In one embodiment, the input circuit 304 inputs a data strobe signal. A data strobe signal may be used as type of clock for a data signal. An example of a data strobe signal is a DQS signal, which is used in a number of different memory interfaces. For example, the Open NAND Flash Interface (ONFI) Specification allows for use of a DQS signal.

During the normal mode, the output circuit 306 outputs a voltage signal through the I/O contacts 308, under control of the control circuit 302. Thus, during the normal mode, the voltage signal is not routed from the output circuit 306 to the input circuit 304. In one embodiment, the output circuit 306 outputs a data voltage signal. For example, the data voltage signal may contain data that was stored in a memory structure. However, the output circuit 306 may output a voltage signal that is not a data signal.

Figure 4:
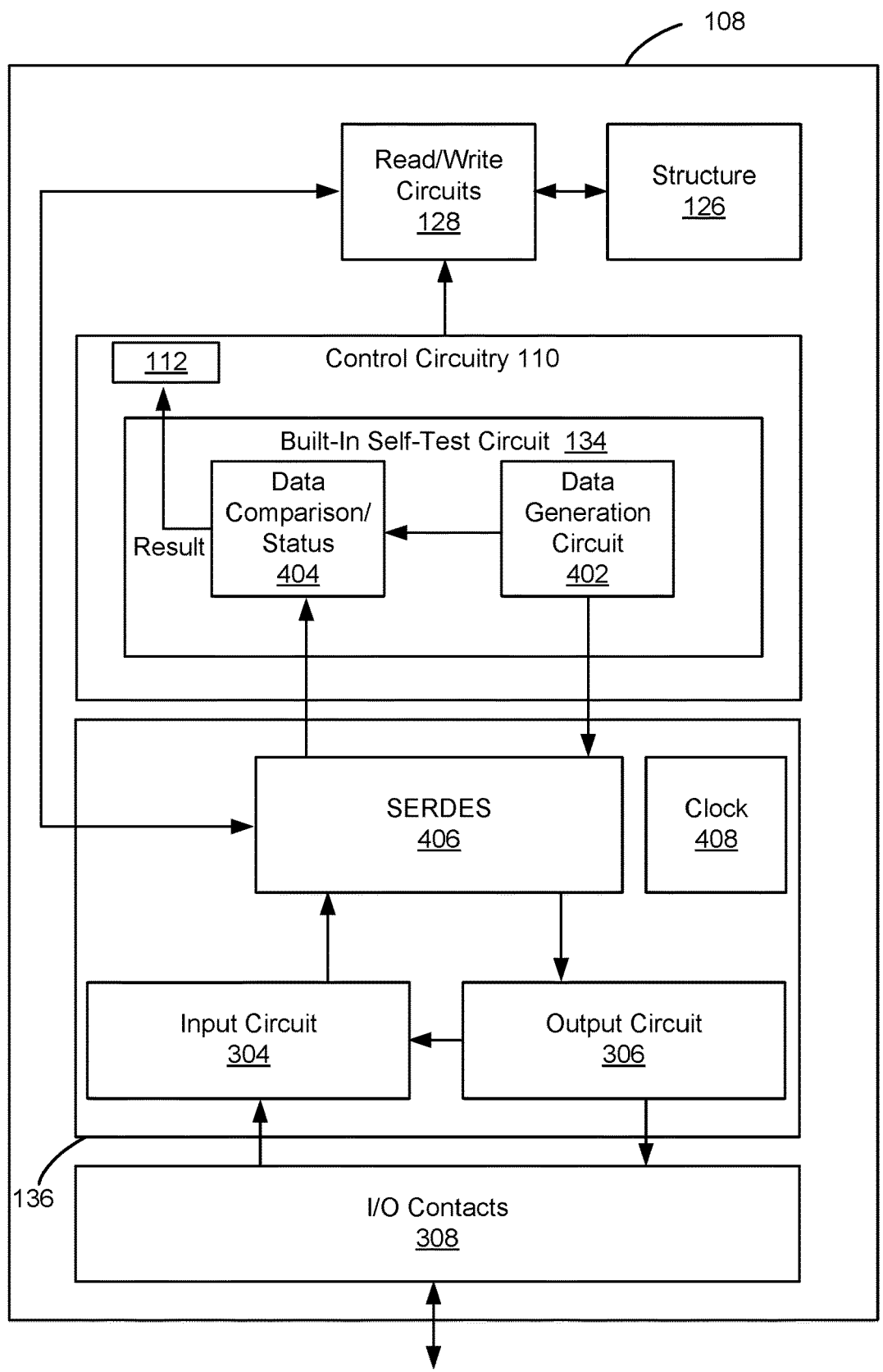
FIG. 4 depicts one embodiment of a memory die.

FIG. 4 depicts one embodiment of a memory die 108. The die in FIG. 4 is one embodiment of the memory die 108 in FIG. 1. The built-in self-test circuit 134 has a data generation circuit 402 and a data comparison/status unit 404. The data generation circuit 402 generates test data, which is sent to the serializer/de-serializer (SERDES) 406. In one embodiment, the SERDES 406 takes in parallel test data from the data generation circuit 402 and outputs serial test data to the output circuit 306. The clock 408 outputs a clock signal that may be provided to various components on the memory die 108. The clock signal may be used to control the timing of data transfer within the memory die 108. In one embodiment, the clock 408 contains a phase locked loop (PLL).

The control circuitry 110 routes the serial test data internally from the output circuit 306 to the input circuit 304. The input circuit 304 sends the serial test data back to the SERDES 406, which converts the serial test data back to parallel test data. The parallel test data is provided from SERDES 406 to the data comparison/status 404. The data comparison/status 404 also inputs the parallel test data that was generated by the data generation circuit 402. The data comparison/status 404 compares these two test data inputs, and outputs a test result based on the comparison. For example, the test result may simply indicate whether or not the two test data inputs match.

The test result may be provided to the state machine 112, such that the test result may be sent outside of the memory die 108. In some cases, the controller 122 might not be available when the memory die 108 is under test. Hence, the test result is not necessarily sent to the controller 122, although that is one possibility. In one embodiment, the test result is sent to a tester that tests many memory dies 108. For example, the tester may test many memory dies during die sort (also referred to as wafer sort). The tester may be any electronic device, such as, for example, a computer system having a processor that executes program instructions to test memory die. In one embodiment, the tester instructs the memory die 108 to enter the test mode. Thus, the built-in self-test circuit 134 may initiate the test mode in response to a command from a source external to the memory die 108.

In one embodiment, the SERDES 406 is in communication with the read/write circuits 128. The SERDES 406 may transfer data from/to the read/write circuits 128 to allow reads and writes from/to the structure 126. In one embodiment, the read/write circuits 128 contain buffers or latches for holding data to be written to the structure 126, or data that was read from the structure 126. In one embodiment, the SERDES 406 provides data to be written to the structure 126 to the buffers or latches in the read/write circuits 128. This data is received from the input circuit 304 from outside of the memory die 108. The read/write circuits 128 then write this data to the structure 126 under the control of the state machine 112. In one embodiment, the read/write circuits 128 read data from the structure 126 under the control of the state machine 112, and put the data into the buffers or latches in the read/write circuits 128. The SERDES 406 then accesses this data and sends it to the data out circuit 306 to be transferred out of the memory die 108.

Figure 5:
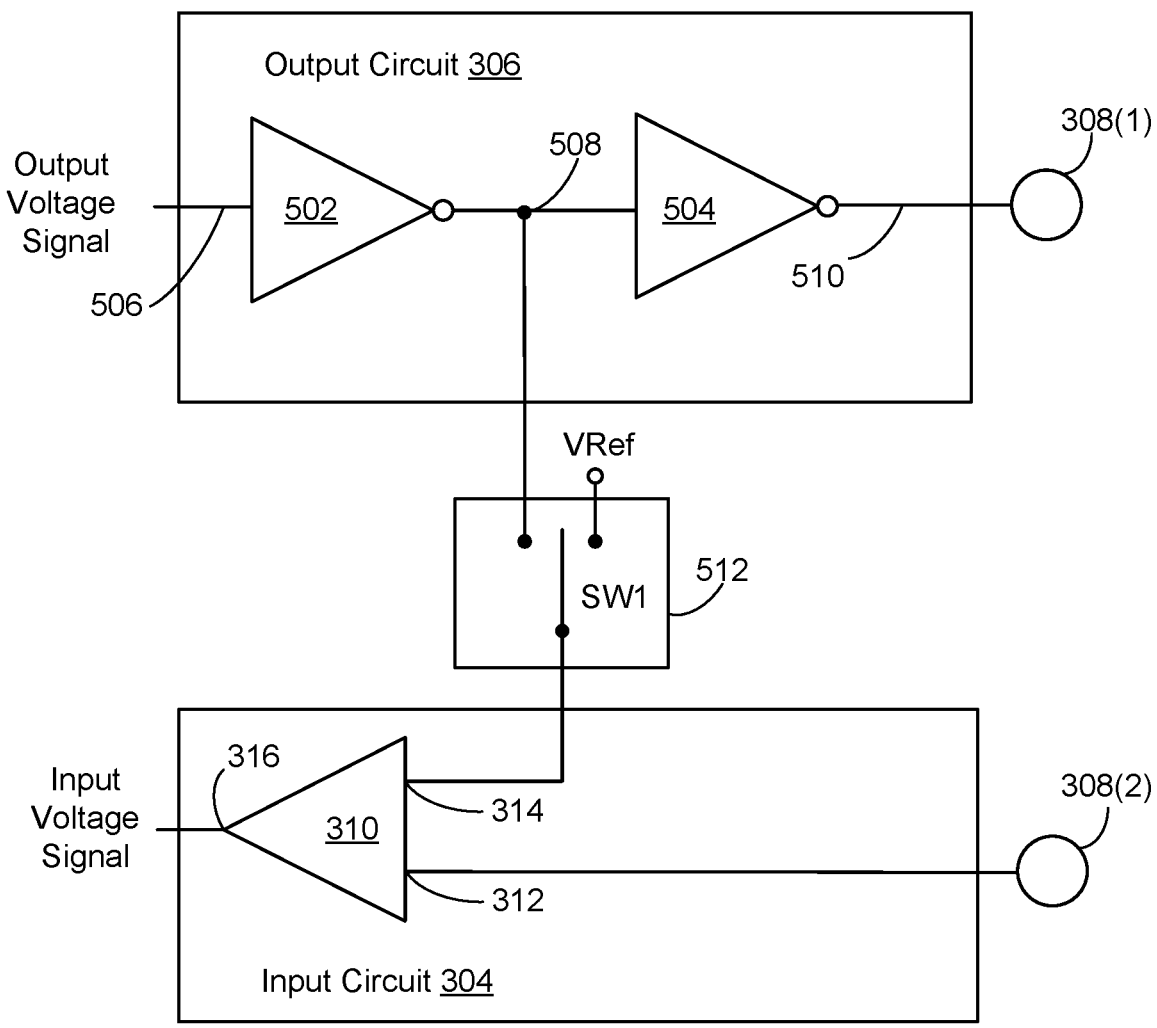
FIG. 5 depicts one embodiment of a portion of input/output circuits, which are connected to I/O contacts.

FIG. 5 depicts one embodiment of a portion of input/output circuits, which are connected to I/O contacts. The input/output circuits may be within input/output circuits 136 on memory die 108. The output circuit 306 in FIG. 5 is one embodiment of output circuit 306 in FIG. 3. The input circuit 304 in FIG. 5 is one embodiment of input circuit 304 in FIG. 3. The output circuit 306 in FIG. 5 is one embodiment of output circuit 306 in FIG. 4. The input circuit 304 in FIG. 5 is one embodiment of input circuit 304 in FIG. 4.

FIG. 5 depicts two I/O contacts 308(1), 308(2). The I/O contacts 308 may include contact pads that are bonded to a semiconductor die (e.g., memory die 108). The I/O contacts 308 may include other conductive elements that provide an electrical connection to the contact pads. In one embodiment, the semiconductor die can be placed into a package after testing the semiconductor die. However, note that during a die sort test of the semiconductor die, the semiconductor die is typically not yet packaged. In one embodiment, the two I/O contacts 308(1), 308(2) are used for data transfer. The semiconductor die may have additional I/O contacts 308 for data transfer. For example, there might be 8, 16, 32, or some other number of I/O contacts 308 for data transfer. In some embodiments, some of the I/O contacts 308 have a function other than data transfer. In one embodiment, the two I/O contacts 308(1), 308(2) could be for a data strobe signal. For example, some devices have a DQS contact and a DQSn contact. As noted above, a DQS signal may be used as a data strobe.

FIG. 5 depicts a portion of one section of the output circuit 306 that is connected to I/O contacts 308(1). The output circuit 306 may have multiple sections, each of which is connected to a different I/O contact 308. Two stages 502, 504 of the output circuit 306 are depicted in FIG. 5. However, the output circuit 306 may have many more stages. Stage 502 has an input 506 that receives a data out signal. The output of stage 502 is connected to the input of stage 504. Node 508 is between the output of stage 502 and the input of stage 504. Herein, the term "node" in an electrical circuit is not limited to a single point in the electrical circuit, but could refer to two points in the electrical circuit. For example, with brief reference to FIG. 10, node 508 includes first point 508a and second point 508b. In this case, the voltage between these two points 508a, 508b is the voltage at that node 508. In some cases, a node may refer to a single point in an electrical circuit. Typically, in such a case, the voltage at that node will be the voltage at that point relative to ground. With reference again to FIG. 5, stage 504 is a final stage that has its output 510 connected to I/O contact 308(1). Stage 504 may be referred to as an off-chip driver, as stage 504 provides the output voltage signal to the I/O contact 308(1). Stage 502 may be referred to as a pre-driver.

The input circuit 304 is associated with I/O contact 308(2). The input circuit 304 may have multiple sections, each of which is connected to a different I/O contact 308. The input circuit 304 has a comparator 310 having a first input 312, a second input 314, and an output 316. The first input 312 is connected to I/O contact 308(2). Because the first input 312 is connected to I/O contact 308(2), the first input 312 may be referred to as an "external input", as it allows input to be provided via an I/O contact 308. The second input 314 is connected to switching logic 512. The second input 314 may be referred to as an "internal input" as it is not connected to any I/O contact 308. Switching logic 512 has a switch (SW1) that is able to connect the second input 314 to either a reference voltage (Vref) or to the node 508 in the output circuit 306. With reference to FIG. 3, the switching logic 512 may be considered to be part of the control circuit 302. With reference to FIGS. 1 and 4, the switching logic 512 may be considered to be part of the control circuitry 110, and may operate under control of the state machine 112.

Figure 6A:
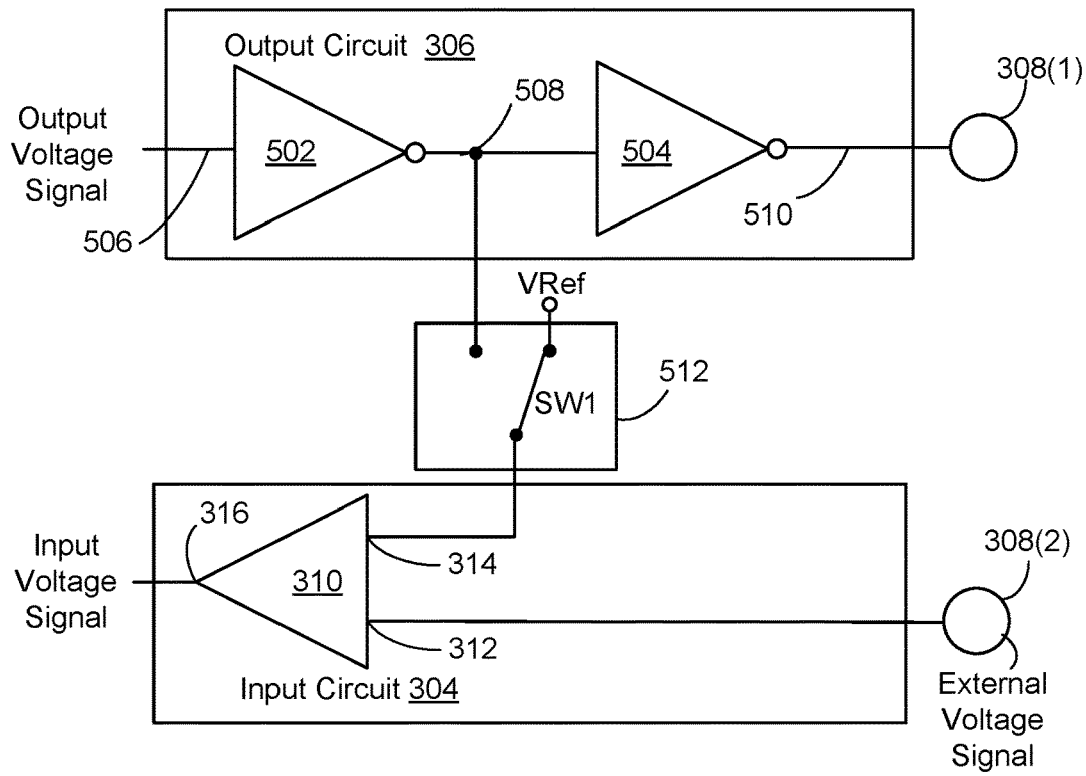
FIG. 6A depicts the input/output circuits of FIG. 5, with switching logic in a position that may be used during a normal mode of operation.

FIG. 6A depicts the input/output circuits of FIG. 5, with the switching logic 512 in a position that may be used during a normal mode of operation. During normal operation, SW1 connects the reference voltage Vref to the second input 314 of the comparator 310 in the input circuit 304. An external voltage signal is received on I/O contact 308(2). The external voltage signal is provided to the first input 312 of the comparator 310. Thus, the input voltage signal is based on a comparison of the external voltage signal with the reference voltage. During the normal mode, the output circuit 306 may be used to provide an output voltage signal to I/O contact 308(1).

Figure 6B:
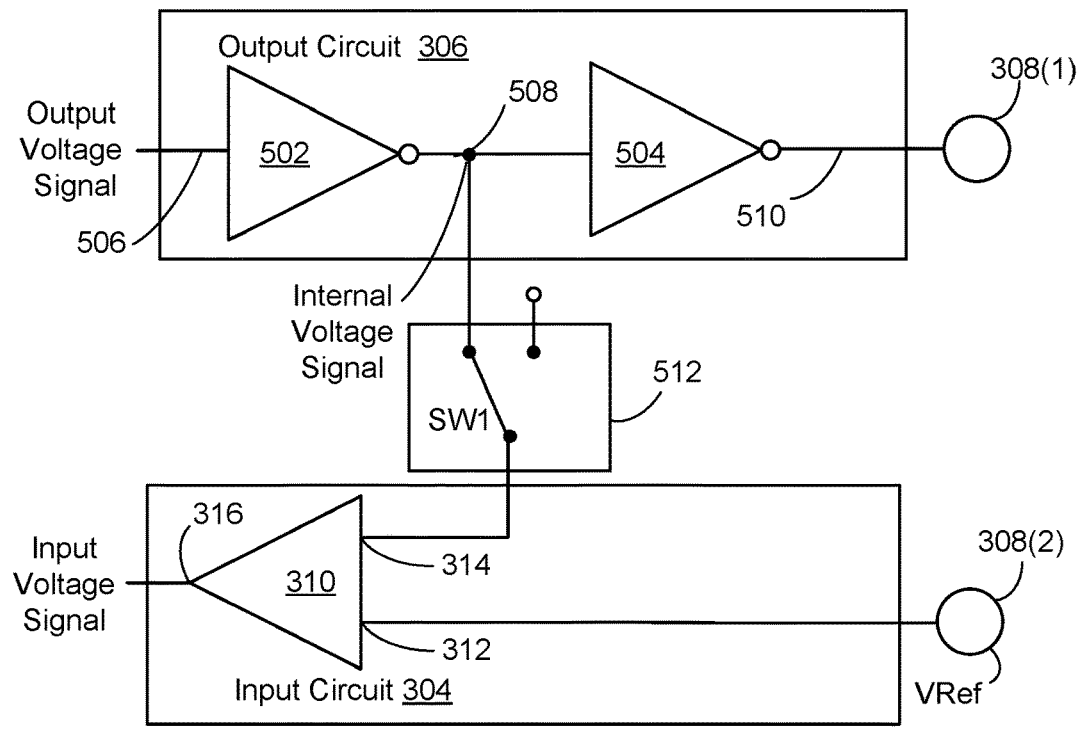
FIG. 6B depicts the input/output circuits of FIG. 5, with switching logic in a position that may be used during a test mode of operation.

FIG. 6B depicts the input/output circuits of FIG. 5, with the switching logic 512 in a position that may be used during a test mode of operation. During the test mode, SW1 connects node 508 in the output circuit 306 to the second input 314 of the comparator 310 in the input circuit 304. Therefore, the internal voltage signal is provided to the second input 314 of the comparator 310. A reference voltage may be received on I/O contact 308(2). The voltage signal is provided to the first input 312 of the comparator 310. Thus, the input voltage signal is based on a comparison of the internal voltage signal with the reference voltage.

Note that the configuration in FIG. 6B allows essentially the entire I/O circuit to be tested, while avoiding transferring a voltage signal over an I/O contact 308. For example, the comparator 310 may be the first stage of the input circuit 304. Stage 504 may be the last stage of numerous stages of the output circuit 306. Hence, most of the output circuit 306 may be tested. Also, other circuitry in the semiconductor die 300 besides the input circuit 304 and the output circuit 304 could also be tested.

In some embodiments, the semiconductor die is operated in a test mode at one point in time, and in a normal mode in another point in time. The test mode may be used to test an I/O data path in the semiconductor die. The normal mode may be used to input data to the semiconductor die and/or to output data from the semiconductor die. FIG. 7 depicts a flowchart of one embodiment of a process 700 of operating an input circuit 304 in two modes. Reference will be made to elements in FIGS. 6A and 6B when describing process 700; however, process 700 is not limited to elements depicted in FIGS. 6A and 6B. In one embodiment, the input circuit 304 is on a memory die 108 having memory structure 126 for storage of data; however, the input circuit 304 could be on a semiconductor die that does not have a memory structure 126 for storage of data.

Step 702 includes configuring a semiconductor die to operate in a test mode. In one embodiment, the semiconductor die receives a command from outside the semiconductor die that instructs the semiconductor die to operate in the test mode. Step 702 may include controlling the switching logic 512 such that SW1 connects node 508 to the second input 314 of the comparator 310 in the input circuit 304.

Step 704 includes operating the input circuit 304 in the test mode in which the control circuit (e.g., control circuit 302, control circuitry 110) provides an internal voltage signal from the output circuit 306 to the second input 314 of the input circuit 304. In an embodiment of the test mode, the input circuit 304 compares a reference voltage at the first input 312 with an internal voltage signal from the output circuit 306 at the second input 314 to generate an input voltage signal at output 316. In one embodiment, the first input 312 is connected to I/O contact 308(2), such that the first input 312 receives a voltage that appears at I/O contact 308(2). Step 704 may include providing the reference voltage to the I/O contact 308(2). For example, testing logic can provide the reference voltage to the I/O contact 308(2) during a die sort. However, step 704 is not limited to being performed during die sort. Step 704 may be performed at any time. In one embodiment, controller 122 provides the reference voltage to I/O contact 308(2). In one embodiment, the built-in self-test provides the reference voltage to the first input 312. For example, switching logic 512 may be configured to provide the reference voltage to the first input 312.

Step 706 includes configuring a semiconductor die to operate in a normal mode. The line between step 704 and 706 is dashed to indicate that a substantial time may pass between these two steps. The semiconductor die could be powered off and back on between steps 704 and 706, but this is not a requirement. In one embodiment, by default the semiconductor die enters the normal mode upon power on. Thus, there is not necessarily a special command to instruct the semiconductor die to enter the normal mode. In one embodiment, the semiconductor die receives a command from outside the semiconductor die that instructs the semiconductor die to operate in the normal mode. Step 706 may include controlling the switching logic 512 such that SW1 connects the reference voltage (Vref) to the second input 314 of the comparator 310 in the input circuit 304.

Step 708 includes operating the input circuit 304 in the normal mode in which the control circuit provides a reference voltage to the second input 314 of the input circuit 304. In an embodiment of the normal mode, the input circuit 304 compares an external voltage signal from I/O contact 308(2) at the first input 312 with a reference voltage at the second input 314 to generate an input voltage signal at output 316. Step 708 may include receiving the external voltage signal at I/O contact 308(2) from controller 122. Step 708 may include providing the reference voltage to the switching logic 512.

In some embodiments, I/O circuits of a semiconductor die are tested during the test mode. FIG. 8 depicts a flowchart of one embodiment of a process 800 of controlling a semiconductor die during a test mode. The process 800 may be used to test, for example, I/O circuits in the semiconductor die. Reference will be made to the memory die 108 in FIG. 4 to discuss process 800. However, process 800 is not limited to a memory die. Process 800 may be performed during step 704 of process 700. Thus, process 800 may be performed when the semiconductor die is in the test mode.

Step 802 includes providing an internal voltage signal to an output circuit 306 on the semiconductor die. The output circuit 306 has a driver 504 configured to drive an I/O contact 308(1) of the semiconductor die. Step 802 may include the data generation circuit 402 generating a test voltage signal. In one embodiment, the test voltage signal is provided to SERDES 406. SERDES 406 may provide the test voltage signal to the output circuit 306.

Step 804 includes routing the internal voltage signal from an input of the driver 504 to an input 314 of an input receiver (e.g., comparator 310) on the semiconductor die while receiving a reference voltage (e.g., Vref) at an input 312 of the input receiver via an input/output contact 308(2) to the semiconductor die.

Step 806 includes generating an input voltage signal based on a comparison of the internal voltage signal at the input 314 with the reference voltage at the input 312. Step 806 may be performed by comparator 310. The input voltage signal may be provided to SERDES 406, which may provide the input voltage signal to data comparison/status 404.

Step 808 includes comparing the internal voltage signal that was provided to the output circuit with the input voltage signal generated at the input receiver. Step 808 may be performed by data comparison/status 404.

Step 810 includes generating a test result based on the comparison. The test result may be provided from data comparison/status 404 to state machine 112. The state machine 112 may provide the test result to, for example, a test that is external to the semiconductor die.

As noted above, the semiconductor die may be operated in a normal mode. For example, a memory die 108 may be operated in a normal mode in which data is written to and read from memory structure 126. FIG. 9 depicts a flowchart of one embodiment of a process 900 of controlling a memory die 108 in the normal mode. Process 900 is one embodiment of step 708 in process 700.

Step 902 includes providing a reference voltage to a second input 314 of an input receiver (e.g., comparator 310). In one embodiment, the state machine 112 operates switching logic 512 to connect SW1 to the reference voltage Vref.

Step 904 includes receiving an external voltage signal from an input/output contact 308(2) at the first input 312 of the input receiver. In one embodiment, controller 122 provides the external voltage signal to input/output contact 308(2).

Figure 11:
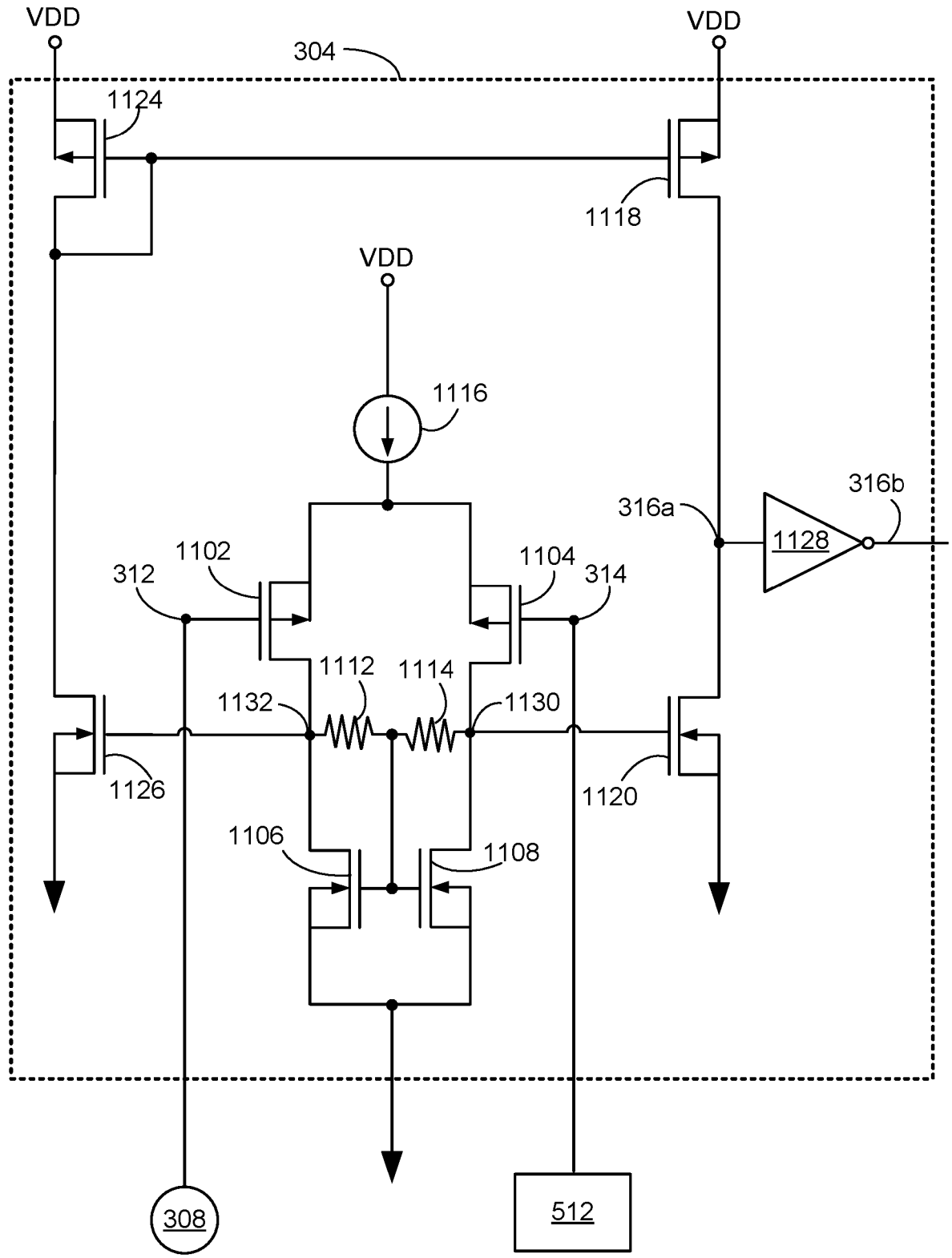
FIG. 11 is a schematic diagram of one embodiment of a portion of a data input circuit.

Step 906 includes comparing the external voltage signal at the first input 312 of the input receiver with the reference voltage at the second input 314 of the input receiver to generate an input voltage signal at an output 316 of the input receiver. Further details of one embodiment of an input receiver that is capable of such comparison are depicted in FIG. 11.

Step 908 includes using the input voltage signal to write data to a memory structure 126 on the semiconductor die. Step 908 may be performed at the control of the state machine 112. The state machine 112 may cause data from the input receiver to be transferred to latches or buffers in the read/write circuits 128. The state machine 112 may control the read/write circuits 128, as well as the column decoder 132 to write the data to a target location in the memory structure 126.

Figure 10:
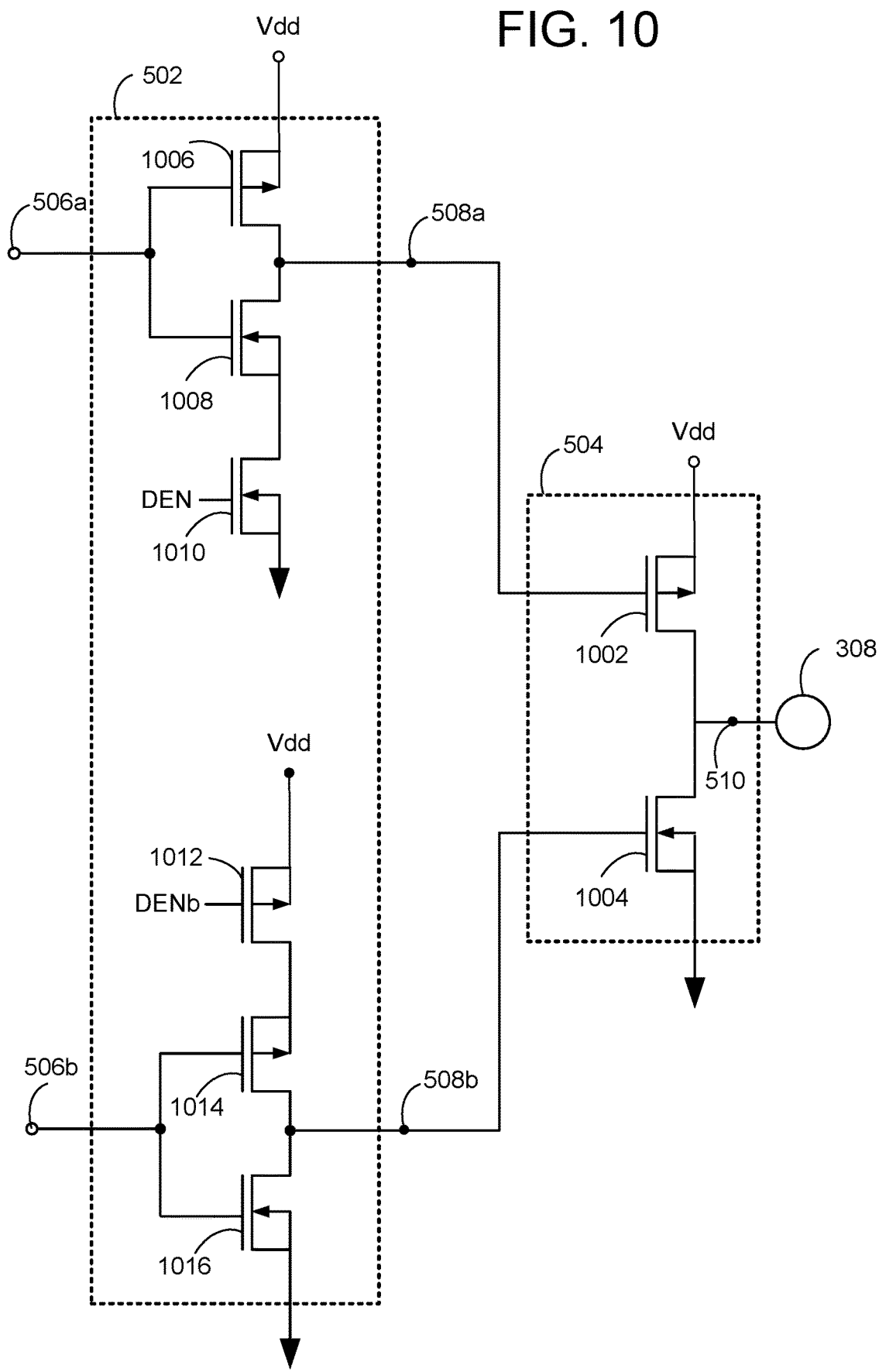
FIG. 10 is a schematic diagram of one embodiment of a portion of a data output circuit.

FIG. 10 is a schematic diagram of one embodiment of a portion of an output circuit 306. FIG. 10 depicts one embodiment of the output circuit 306 in FIGS. 3, 4, 5, 6A, and/or 6B. FIG. 10 depicts two stages 502, 504 of the output circuit 306 that are associated with an I/O contact 308. The output circuit 306 may have additional stages. Stage 504 may be referred to as an off-chip driver. Stage 504 has PMOS transistor 1002 and NMOS transistor 1004, which are connected in series between a supply voltage (Vdd) and ground. The output 510 of stage 504 is between PMOS transistor 1002 and NMOS transistor 1004.

Stage 502 has PMOS transistor 1006, NMOS transistor 1008, and NMOS transistor 1010, which are connected in series between a supply voltage (Vdd) and ground. The gates of PMOS transistor 1006 and NMOS transistor 1008 are connected together at an input node 506a. Stage 502 has PMOS transistor 1012, PMOS transistor 1014, and NMOS transistor 1016, which are connected in series between a supply voltage (Vdd) and ground. The gates of PMOS transistor 1014 and NMOS transistor 1016 are connected together at an input node 506b. The output circuit 306 may have additional stages, one of which is connected to input node 506a and input node 506b. The gate of NMOS transistor 1010 is driven by DEN, which may be used to bias NMOS transistor 1010. The gate of PMOS transistor 1012 is driven by DENb, which may be used to bias PMOS transistor 1012.

Together nodes 506a, 506b are one embodiment of node 506 in FIG. 5. In one embodiment, a data out signal is sampled between nodes 506a and 506b. During test mode, the data out signal may be referred to as an internal voltage signal. Together, point 508a and point 508b are one embodiment of node 508 in FIG. 5. In one embodiment, the internal voltage signal is sampled between points 508a and 508b, and routed to the data input circuit.

FIG. 11 is a schematic diagram of one embodiment of a portion of the input circuit 304 in FIGS. 3, 4, 5, 6A, and/or 6B. The input circuit 304 is connected to an I/O contact 308, and to switching logic 512, as has been previously described.

The gate of PMOS transistor 1102 is one embodiment of first input 312. The gate of PMOS transistor 1102 is connected to an I/O contact 308. The gate of PMOS transistor 1102 may be referred to as an external input. The gate of PMOS transistor 1104 is one embodiment of second input 314. The gate of PMOS transistor 1104 is connected to switching logic 512. The gate of PMOS transistor 1104 may be referred to as an internal input. Herein, the gate of a transistor is an example of a control terminal. However, the term "control terminal" is not limited to a gate of an FET. The term control terminal could also refer to, for example, the base of a bipolar junction transistor.

The input circuit 304 has two output nodes 316a, 316b, which are compliments of each other. That is, inverter 1128 has its input connected to output node 316a and its output connected to output node 316b. In one embodiment, output node 316a is used in the test mode. In one embodiment, output node 316b is used in the normal mode. The two output nodes 316a, 316b are one embodiment of output 316 in FIG. 5. The voltage at the output nodes 316a, 316b is based on a comparison of the voltages at the two inputs 312, 314.

The input circuit 304 has circuit elements that may serve to compare the voltages at the inputs and circuit elements that serve to provide the output voltage signal. The comparison elements may include PMOS transistor 1102, PMOS transistor 1104, NMOS transistor 1106, NMOS transistor 1108, resistor 1112, resistor 1114, and current source 1116. Output elements may include PMOS transistor 1118, NMOS transistor 1120, PMOS transistor 1124, and NMOS transistor 1126. Node 1130 is connected to the gate of NMOS transistor 1120, such that the voltage at node 1130 serves as one comparison point. Node 1132 is connected to the gate of NMOS transistor 1126. NMOS transistor 1126 has its drain connected to the gate of PMOS transistor 1118, such that the voltage at node 1132 may serve as another comparison point.

Many alternatives to the input circuit 304 are possible. For example, In FIG. 11, PMOS transistors are used for the transistors whose gates are inputs 312, 314. In another embodiment, NMOS transistors are used for the transistors whose gates are inputs 312, 314. In one embodiment, the input circuit 304 has two alternative input stages. One input stage has PMOS transistors at the inputs 312, 314 such as in FIG. 11, whereas another input stage uses NMOS transistors at the inputs 312, 314. In such a design, only one of the two alternative input stages is used at a given time.

A first embodiment disclosed herein includes an apparatus comprising an input circuit associated with a first input/output (I/O) contact. The input circuit comprises a first input and a second input. The first input is in communication with the first I/O contact. The input circuit is configured to compare a voltage signal at one of the first input or the second input with a reference voltage at the other of the first input or the second input to generate an input voltage signal. The apparatus further comprises an output circuit associated with a second I/O contact. The apparatus further comprises a control circuit configured to operate in a first mode in which the control circuit provides a reference voltage to the second input of the input circuit. The control circuit is further configured to operate in a second mode in which the control circuit provides an internal voltage signal from the output circuit to the second input of the input circuit.

In a second embodiment, in furtherance of the first embodiment, in the first mode the input circuit compares an external voltage signal from the first I/O contact at the first input with the reference voltage at the second input to generate a first input voltage signal. Also, in the second mode the input circuit compares a reference voltage at the first input with the internal voltage signal from the output circuit at the second input to generate a second input voltage signal.

In a third embodiment, in furtherance of the second embodiment, the control circuit is further configured to sample the first input voltage signal from a first output node of the input circuit when in the first mode. Also, the control circuit is further configured to sample the second input voltage signal from a second output node of the input circuit when in the second mode. The first input voltage signal at the first output node is a compliment of the second input voltage signal at the second output node.

In a fourth embodiment, in furtherance of any of the first to third embodiments, the control circuit is further configured to provide the internal voltage signal to the output circuit in the second mode, the output circuit having a plurality of stages including a final stage configured to drive the second I/O contact. The control circuit is further configured to provide the internal voltage signal from a node at an output of a stage of the output circuit other than the final stage to the second input of the input circuit in the second mode.

In a fifth embodiment, in furtherance of the fourth embodiment, the control circuit comprises switching logic configured to connect the second input of the input circuit to the reference voltage when in the first mode and to connect the second input of the input circuit to the node in order to provide the internal voltage signal when in the second mode.

In a sixth embodiment, in furtherance of any of the first to fifth embodiments, the input circuit comprises a first transistor having a first control terminal and a second transistor having a second control terminal. The first control terminal is the first input and the second control terminal is the second input. The first control terminal is connected to the first I/O contact.

In a seventh embodiment, in furtherance of the sixth embodiment, the first transistor and the second transistor are configured such that the input voltage signal is based on a comparison of respective voltages at the first control terminal and the second control terminal.

In an eighth embodiment, in furtherance of any of the first to seventh embodiments, the control circuit comprises a built-in self-test circuit in communication with the input circuit and with the output circuit. The built-in self-test circuit is configured to provide the internal voltage signal to the output circuit during the second mode. The built-in self-test circuit is configured to receive the internal voltage signal from the input circuit during the second mode. The built-in self-test circuit is configured to compare the internal voltage signal received from the input circuit with the internal voltage signal provided to the output circuit and to output a test result based on the comparison.

In a ninth embodiment, in furtherance of any of the first to eighth embodiments, the apparatus further comprises non-volatile memory cells in communication with the input circuit and with the output circuit. The control circuit is further configured to control the input circuit in order to provide data from the first I/O contact to the non-volatile memory cells in the first mode, wherein the control circuit is further configured to control the output circuit in order to provide data from the non-volatile memory cells to the second I/O contact in the first mode.

In a tenth embodiment, in furtherance of any of the first to ninth embodiments, the apparatus further comprises a clock, and a data generation circuit configured to generate the internal voltage signal.

In an eleventh embodiment, in furtherance of any of the first to tenth embodiments, the first input is an external input that is connected to the first I/O contact and the second input is an internal input that is not connected to any I/O contact.

One embodiment of technology disclosed herein includes a method of controlling a semiconductor die. The method comprises providing an internal voltage signal to an output circuit on the semiconductor die. The output circuit has a driver. The method comprises routing the internal voltage signal from an input of the driver to a first input of an input receiver on the semiconductor die while receiving a reference voltage at a second input of the input receiver via a first input/output contact to the semiconductor die. The driver is connected to a second input/output contact to the semiconductor die. The method comprises generating an input voltage signal based on a comparison of the internal voltage signal at the first input with the reference voltage at the second input. The method comprises comparing the internal voltage signal that was provided to the output circuit with the input voltage signal generated at the input receiver. The method comprises generating a test result based on the comparison.

One embodiment of technology disclosed herein includes a memory die comprising non-volatile memory cells, a plurality of input/output (I/O) contacts, an input receiver, an output circuit, and a control circuit. The input receiver comprises a pair of transistors comprising a first transistor having a first control terminal and a second transistor having a second control terminal. The first control terminal is coupled to a first I/O contact of the I/O contacts. The output circuit has a plurality of stages, including an off-chip driver stage having an output configured to drive a second contact of the I/O contacts. The output circuit has an input configured to receive an output voltage signal at an input stage. The control circuit is configured to operate in a normal mode in which the control circuit provides a reference voltage to the second control terminal. The input receiver compares an external voltage signal from the first I/O contact at the first control terminal with the reference voltage to generate a first input voltage signal that the control circuit uses to write data to the non-volatile memory cells. The control circuit is configured to operate in a test mode in which the control circuit routes the output voltage signal from an output of a stage of the output circuit other than the off-chip driver stage to the second control terminal. The input receiver compares a reference voltage from the first I/O contact at the first terminal with the output voltage signal at the second control terminal to generate a second input voltage signal.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   an input circuit associated with a first input/output (I/O) contact, wherein the input circuit comprises a first input and a second input, wherein the first input is in communication with the first I/O contact, wherein the input circuit is configured to compare a voltage signal at one of the first input or the second input with a reference voltage at the other of the first input or the second input to generate an input voltage signal;
   an output circuit associated with a second I/O contact; and
   a control circuit configured to operate in a first mode in which the control circuit provides a reference voltage to the second input of the input circuit, the control circuit is further configured to operate in a second mode in which the control circuit provides an internal voltage signal from the output circuit to the second input of the input circuit.

2. The apparatus of claim 1, wherein:
   in the first mode the input circuit compares an external voltage signal from the first I/O contact at the first input with the reference voltage at the second input to generate a first input voltage signal; and
   in the second mode the input circuit compares a reference voltage at the first input with the internal voltage signal from the output circuit at the second input to generate a second input voltage signal.

3. The apparatus of claim 2, wherein the control circuit is further configured to:
   sample the first input voltage signal from a first output node of the input circuit when in the first mode; and
   sample the second input voltage signal from a second output node of the input circuit when in the second mode, wherein the first input voltage signal at the first output node is a compliment of the second input voltage signal at the second output node.

4. The apparatus of claim 1, wherein the control circuit is further configured to:
   provide the internal voltage signal to the output circuit in the second mode, the output circuit having a plurality of stages including a final stage configured to drive the second I/O contact; and
   provide the internal voltage signal from a node at an output of a stage of the output circuit other than the final stage to the second input of the input circuit in the second mode.

5. The apparatus of claim 4, wherein the control circuit comprises:
   switching logic configured to connect the second input of the input circuit to the reference voltage when in the first mode and to connect the second input of the input circuit to the node in order to provide the internal voltage signal when in the second mode.

6. The apparatus of claim 1, wherein the input circuit comprises:
   a first transistor having a first control terminal and a second transistor having a second control terminal, wherein the first control terminal is the first input and the second control terminal is the second input, wherein the first control terminal is connected to the first I/O contact.

7. The apparatus of claim 6, wherein:
   the first transistor and the second transistor are configured such that the input voltage signal is based on a comparison of respective voltages at the first control terminal and the second control terminal.

8. The apparatus of claim 1, wherein the control circuit comprises:
   a built-in self-test circuit in communication with the input circuit and with the output circuit, wherein the built-in self-test circuit is configured to provide the internal voltage signal to the output circuit during the second mode, wherein the built-in self-test circuit is configured to receive the internal voltage signal from the input circuit during the second mode, wherein the built-in self-test circuit is configured to compare the internal voltage signal received from the input circuit with the internal voltage signal provided to the output circuit and to output a test result based on the comparison.

9. The apparatus of claim 1, further comprising:
   non-volatile memory cells in communication with the input circuit and with the output circuit, wherein the control circuit is further configured to control the input circuit in order to provide data from the first I/O contact to the non-volatile memory cells in the first mode, wherein the control circuit is further configured to control the output circuit in order to provide data from the non-volatile memory cells to the second I/O contact in the first mode.

10. The apparatus of claim 1, further comprising:
a clock; and
a data generation circuit configured to generate the internal voltage signal.

11. The apparatus of claim 1, wherein the first input is an external input that is connected to the first I/O contact and the second input is an internal input that is not connected to any I/O contact.

12. A method of controlling a semiconductor die, the method comprising:
providing an internal voltage signal to an output circuit on the semiconductor die, the output circuit having a driver;
routing the internal voltage signal from an input of the driver to a first input of an input receiver on the semiconductor die while receiving a reference voltage at a second input of the input receiver via a first input/output contact to the semiconductor die, wherein the driver is connected to a second input/output contact to the semiconductor die;
generating an input voltage signal based on a comparison of the internal voltage signal at the first input with the reference voltage at the second input;
comparing the internal voltage signal that was provided to the output circuit with the input voltage signal generated at the input receiver; and
generating a test result based on the comparison.

13. The method of claim 12, further comprising:
providing a reference voltage to the first input of the input receiver;
receiving an external voltage signal from the first input/output contact at the second input of the input receiver;
comparing the external voltage signal at the second input of the input receiver with the reference voltage at the first input of the input receiver to generate a second input voltage signal at an output of the input receiver; and
providing the second input voltage signal to non-volatile memory cells on the semiconductor die.

14. A memory die comprising:
non-volatile memory cells;
a plurality of input/output (I/O) contacts;
an input receiver comprising a pair of transistors comprising a first transistor having a first control terminal and a second transistor having a second control terminal, wherein the first control terminal is coupled to a first I/O contact of the I/O contacts;
an output circuit having a plurality of stages, including an off-chip driver stage having an output configured to drive a second contact of the I/O contacts, the output circuit having an input configured to receive an output voltage signal at an input stage; and
a control circuit configured to operate in a normal mode in which the control circuit provides a reference voltage to the second control terminal, wherein the input receiver compares an external voltage signal from the first I/O contact at the first control terminal with the reference voltage to generate a first input voltage signal that the control circuit uses to write data to the non-volatile memory cells; and
wherein the control circuit is configured to operate in a test mode in which the control circuit routes the output voltage signal from an output of a stage of the output circuit other than the off-chip driver stage to the second control terminal, wherein the input receiver compares a reference voltage from the first I/O contact at the first terminal with the output voltage signal at the second control terminal to generate a second input voltage signal.

15. The memory die of claim 14, wherein the control circuit comprises:
switching logic configured to provide the reference voltage to the second control terminal when in the normal mode, wherein the switching logic is configured provide the output voltage signal to the second control terminal when in the test mode.

16. The memory die of claim 14, wherein the control circuit comprises:
a built-in self-test circuit in communication with the input receiver and with the output circuit, wherein the built-in self-test circuit is configured to provide the output voltage signal to the output circuit during the test mode, wherein the built-in self-test circuit is configured to receive the output voltage signal from the input receiver during the test mode, wherein the built-in self-test circuit is configured to compare the output voltage signal received from the input receiver with the output voltage signal provided to the output circuit and to output a test result based on the comparison.

17. The memory die of claim 14, wherein the control circuit is further configured to:
sample the first input voltage signal from a first output node of the input receiver when in the normal mode; and
sample the second input voltage signal from a second output node of the input receiver when in the test mode, wherein the first input voltage signal at the first output node is a compliment of the second input voltage signal at the second output node.

18. The memory die of claim 14, wherein the control circuit is configured to route the output voltage signal from an input of the off-chip driver to the second control terminal during the test mode.

19. The memory die of claim 14, wherein the first control terminal is an external input that is connected to the first I/O contact and the second control terminal is an internal input that is not connected to any I/O contact.

20. The memory die of claim 14, further comprising:
a data generation circuit configured to generate the output voltage signal.

* * * * *